(12) United States Patent
Sugamori

(10) Patent No.: US 6,172,544 B1
(45) Date of Patent: Jan. 9, 2001

(54) TIMING SIGNAL GENERATION CIRCUIT FOR SEMICONDUCTOR TEST SYSTEM

(75) Inventor: Shigeru Sugamori, Santa Clara, CA (US)

(73) Assignee: Advantest Corp., Tokyo (JP)

( * ) Notice: Under 35 U.S.C. 154(b), the term of this patent shall be extended for 0 days.

(21) Appl. No.: 09/257,907

(22) Filed: Feb. 25, 1999

(51) Int. Cl.[7] .................................................. H03Q 5/14
(52) U.S. Cl. ............................................ 327/263; 324/276
(58) Field of Search .................................... 327/163, 263, 327/261, 276, 277, 281

(56) References Cited

U.S. PATENT DOCUMENTS

| | | | |
|---|---|---|---|
| 4,601,028 | * 7/1986 | Huffman et al. | 370/15 |
| 5,109,394 | * 4/1992 | Hjerpe et al. | 375/119 |
| 5,465,076 | * 11/1995 | Yamauchi et al. | 331/179 |

* cited by examiner

Primary Examiner—Tuan T. Lam
Assistant Examiner—Linh Nguyen
(74) Attorney, Agent, or Firm—Muramatsu & Associates

(57) ABSTRACT

A timing signal generation circuit to be used in a semiconductor test system which is not affected by voltage changes or temperature changes. The timing signal generation circuit includes a first reference clock, a coarse delay circuit provided with the first reference clock for generating a coarse delay signal having a delay time of an integer multiple of one cycle of the first reference clock on the basis of coarse delay data provided thereto, a second reference clock having a frequency which is predetermined times higher than that of the first reference clock, a first fine delay circuit provided with the second reference clock for producing a fine delay time which is an integer multiple of one cycle of the second reference clock but is smaller than the one cycle of the first reference clock, a selector circuit for selectively applying the coarse delay signal to the first fine delay circuit at an input specified by a select signal, and a second fine delay circuit for receiving an output signal of the first fine delay circuit and adding a delay time which is smaller than the one cycle of the second reference clock to the output signal based on fine delay data. The coarse delay circuit and the second fine delay circuit are formed in a first semiconductor integrated circuit while the first fine delay circuit and the selector circuit are formed in a second semiconductor integrated circuit which has a higher operation speed than that of the first semiconductor integrated circuit.

10 Claims, 3 Drawing Sheets

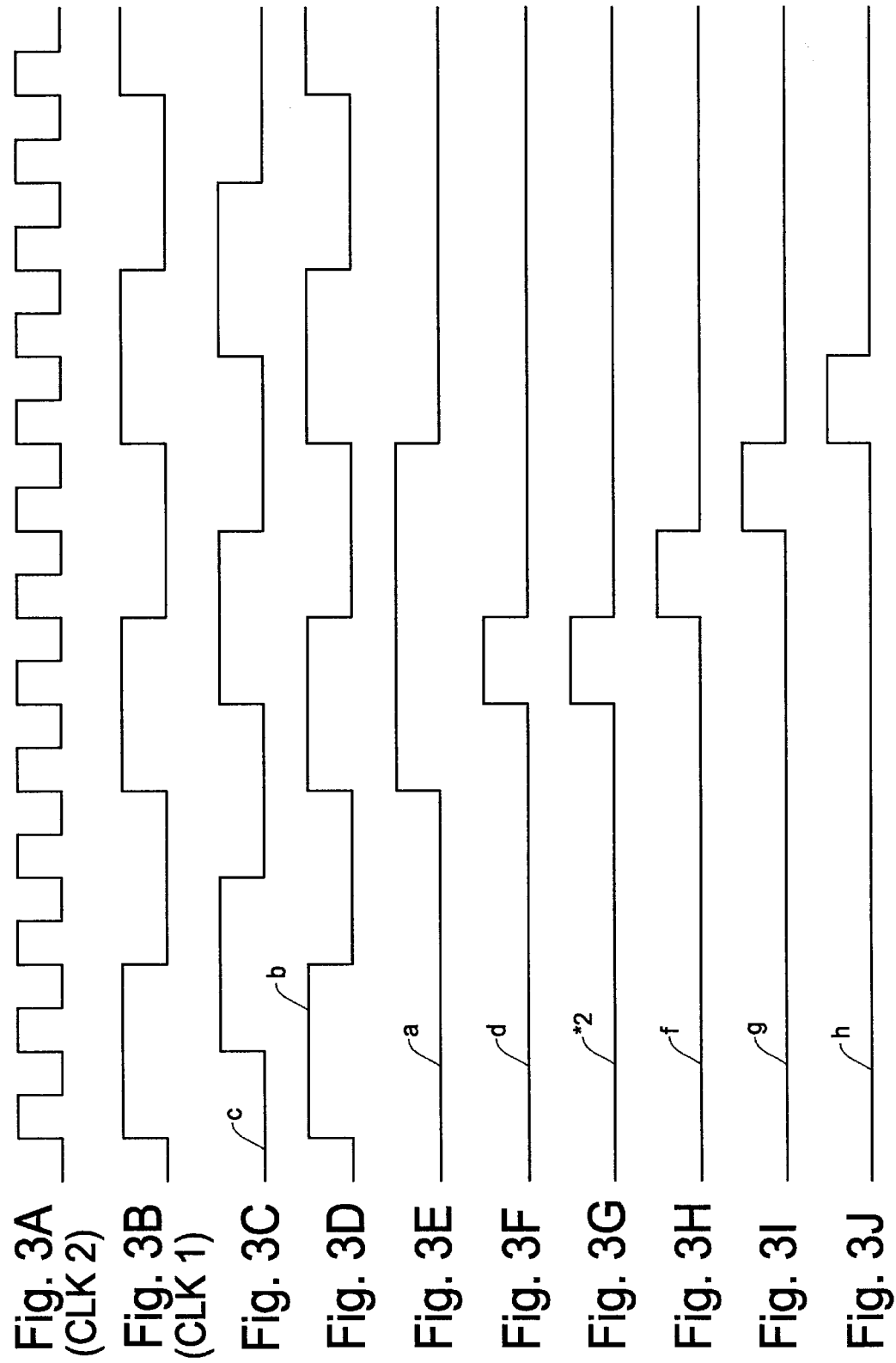

TIMING SIGNAL GENERATION CIRCUIT FOR SEMICONDUCTOR TEST SYSTEM

FIELD OF THE INVENTION

This invention relates to a semiconductor test system for testing semiconductor integrated circuits, and more particularly, to a timing generation circuit for generating timings of various signals to be used in the semiconductor test system with high accuracy and stability.

BACKGROUND OF THE INVENTION

In testing semiconductor integrated circuits by a semiconductor test system, the semiconductor IC device to be tested (device under test) is provided with test signals and the resultant output signals of the device under test are compared with expected value signals prepared in advance to determine whether the intended functions of the integrated circuit under test is performed correctly. Because the recent semiconductor integrated circuits become more and more complicated and high level, the size of the test signals to test such semiconductor integrated circuits must be increased accordingly. Further, to fully evaluate such an integrated circuit, the test signal of high timing resolution must be applied to the device under test. Such timings of the test signal is produced by a timing signal generation circuit.

As noted above, the timing resolution of the test signals used by the semiconductor test system must be very high. In fact, the test signals are usually required to have timing resolution higher than the time period of a reference (system) clock in the semiconductor test system. For example, while a time period of the reference clock used in a semiconductor test system is 10 ns (nanosecond), the timing resolution of the test signals is required to be 0.3 ns or higher. Therefore, the timing generation circuit is configured by a combination of a coarse delay control unit a fine delay control unit. The coarse delay control unit is to produce timings which are integer multiple of one cycle of the reference clock and the fine delay control unit is to produce timings which are substantially smaller than the one cycle of the reference clock signal.

An example of conventional timing generation circuit is shown in FIG. 1. The upper part of FIG. 1 is a coarse delay control unit which produces a timing of an integer multiple of the reference clock cycle. The lower part of FIG. 1 is a fine delay control circuit which produces a timing substantially smaller than one cycle of the reference clock. In the example of FIG. 1, the coarse delay control unit is formed of a counter 11, a register 12, a comparator 13, a flip-flop 14 and an AND gate 16.

In the coarse delay control unit, the counter 11 is reset by a tester rate signal and the coarse delay data is loaded in the register 12. The counter 11 counts the reference clock. The counted data of the counter 11 is compared with the coarse delay data stored in the register 12 by the comparator 13. When both data match with one another, the comparator 13 produces a coincidence signal which is re-timed by the flip-flop 14 and the AND gate 16. Thus, the output of the AND gate 16 shows a delay time which is an integer multiple of the reference clock cycle. The delayed output signal from the AND gate 16 is provided with a delay time which is smaller than the reference clock cycle by the fine delay control unit.

The fine delay control unit is configured by a plurality of delay circuits for producing weighted small delay times. In the example of FIG. 1, the fine delay control unit includes a delay circuit 17 for generating a delay time equal to a ½ cycle of the reference clock and a delay circuit 18 for generating a delay time equal to a ¼ cycle of the reference clock. The delay circuit 17 is formed of AND gates 21 and 22, a delay element 23, and an OR gate 24. Similarly, the delay circuit 18 is formed of AND gates 25 and 26, a delay element 27, and an OR gate 28.

The delay elements 23 and 27 respectively produce the above noted delay times which are ½ cycle and ¼ cycle, respectively, of the reference clock. As shown in the circuit configuration of FIG. 1, by the fine timing data provided to the AND gates, it is determine as to whether or not the input signal to the delay circuit is introduced to the signal path having the delay element for adding the delay time. As a consequence, at the output of the timing generation circuit of FIG. 1, a timing signal having a high timing resolution is produced. In an actual application to a semiconductor test system, a large number of such delay circuits are employed to produce a fine delay time having timing resolution of, for example, 1/32 cycle of the reference clock.

Because the semiconductor test system is a very large scale electric equipment, a large portion of the inner electric circuits are configured by CMOS semiconductor integrated circuits for keeping the cost and power consumption low. Thus, the timing signal generation circuit of FIG. 1 is usually formed as a part of a large scale CMOS integrated circuit. For example, other components of the semiconductor test system, such as driver waveform control circuits and logic comparators, are also formed in the same CMOS semiconductor integrated circuit having the timing signal generation circuit. Consequently, the operation frequency of the timing signal generation circuit is limited to the operation speed of the CMOS integrated circuit. As is known in the art, although the operation speed of CMOS integrated circuits is high compared with other MOS type integrated circuits, the operation speed is lower than that of a bipolar integrated circuit or a gallium arsenide integrated circuit.

Further, in the foregoing fine delay circuit, each delay element is formed of a plurality of CMOS transistors or CMOS gate circuits. Since the operation speed of the CMOS intergrated circuit is not very high as noted above, the reference clock frequency to be used in the timing signal generation circuit cannot be very high, resulting in using the reference clock having a relatively large clock period. Therefore, the delay time assigned to the delay element (such as ½ period or ¼ period of the reference clock) must also be large. For producing such a relatively large delay time, a large number of CMOS gate circuits must be series connected to form the delay element. Accordingly, the delay time produced by such a delay element tends to be subject to voltage changes or temperature changes, resulting in the timing instability. Thus, the conventional timing generation circuit has a drawback in which the timing resolution cannot be sufficiently increased.

SUMMARY OF THE INVENTION

Therefore, it is an object of the present invention to provide a timing signal generation circuit for semiconductor test system which is capable of generating a fine delay time of high resolution and high stability with the use of a relatively simple circuit structure.

It is another object of the present invention to provide a timing signal generation circuit for semiconductor test system which is capable of producing a fine delay time of high stability by creating a large delay time within the fine delay time by dividing a high frequency reference clock and a small delay time within the fine delay time by a combination of gate circuits.

It is a further object of the present invention to provide a timing signal generation circuit for semiconductor test system using a plurality of reference clocks which is capable of producing a fine delay time of high stability by creating a large delay time in the fine delay time by dividing a high frequency reference clock.

It is a further object of the present invention to provide a timing signal generation circuit for semiconductor test system in which the delay time of the timing signal is unaffected by voltage changes or temperature changes.

It is a further object of the present invention to provide a timing signal generation circuit for semiconductor test system which is capable of generating a timing signal having a high accuracy delay time which is unaffected by voltage changes or temperature changes with use of a simple and low cost circuit structure.

In the timing signal generation circuit of the present invention, a large delay time within the fine delay time is created by dividing a high frequency reference clock, thereby generating a timing signal with high resolution and high stability. The timing signal generation circuit includes a first reference clock, a coarse delay circuit provided with the first reference clock for generating a coarse delay signal having a delay time of an integer multiple of one cycle of the first reference clock on the basis of coarse delay data provided thereto, a second reference clock having a frequency which is predetermined times higher than that of the first reference clock, a first fine delay circuit provided with the second reference clock for producing a fine delay time which is an integer multiple of one cycle of the second reference clock but is smaller than the one cycle of the first reference clock, a selector circuit for selectively applying the coarse delay signal to the first fine delay circuit at an input specified by a select signal, and a second fine delay circuit for receiving an output signal of the first fine delay circuit and adding a delay time which is smaller than the one cycle of the second reference clock to the output signal based on fine delay data. The coarse delay circuit and the second fine delay circuit are formed in a first semiconductor integrated circuit while the first fine delay circuit and the selector circuit are formed in a second semiconductor integrated circuit which has a higher operation speed than that of the first semiconductor integrated circuit.

Another aspect of the present invention is a method of generating a timing of a signal for testing a semiconductor device to be used in a semiconductor test system. The method includes the steps of generating a coarse delay signal having a delay time which is an integer multiple of one cycle of a first reference clock on the basis of coarse delay data, producing a first fine delay time which is an integer multiple of one cycle of a second reference clock but is smaller than the one cycle of the first reference clock wherein the second reference clock has a frequency higher than that of the first reference clock by an integer multiple of times, selectively adding the first fine delay time to the coarse delay time, and adding a second fine delay time which is smaller than the one cycle of the second reference clock to the signal added with the first fine delay time.

The timing signal generation circuit can generate a fine delay time of high resolution and high stability with the use of a relatively simple circuit structure. The timing signal generation circuit can produce the fine delay time of high stability by creating a large delay time within the fine delay time by dividing a high frequency reference clock while creating a small delay time within the fine delay time by the combination of gate circuits. The timing signal generation circuit includes a plurality of reference clocks and is capable of producing the fine delay time of high stability by creating a large delay time of the fine delay time by dividing a high frequency reference clock. As a consequence, the timing signal generator of the present invention can generate the timing signal which is unaffected by voltage changes or temperature changes.

BRIEF DESCRIPTION OF THE DRAWING

FIGS. 3A–3J are timing charts showing the operation of the timing signal generation circuit of the present invention shown in FIG. 2.

DETAILED DESCRIPTION OF THE PREFERRED EMBODIMENT

Figure 1:
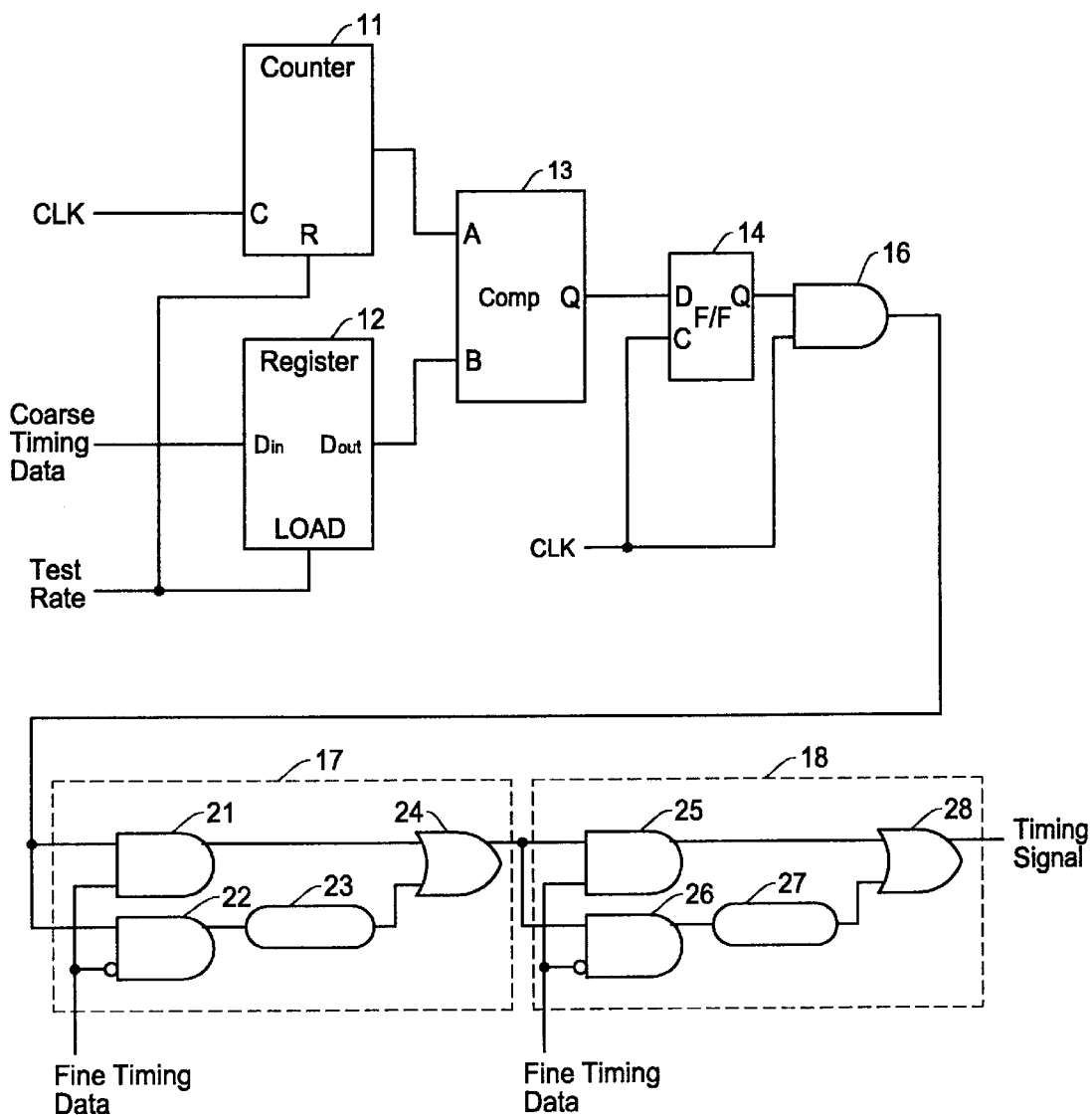
FIG. 1 is a block diagram showing an example of a basic structure of a timing signal generation circuit for a semiconductor test system in the conventional technology.
Figure 2:
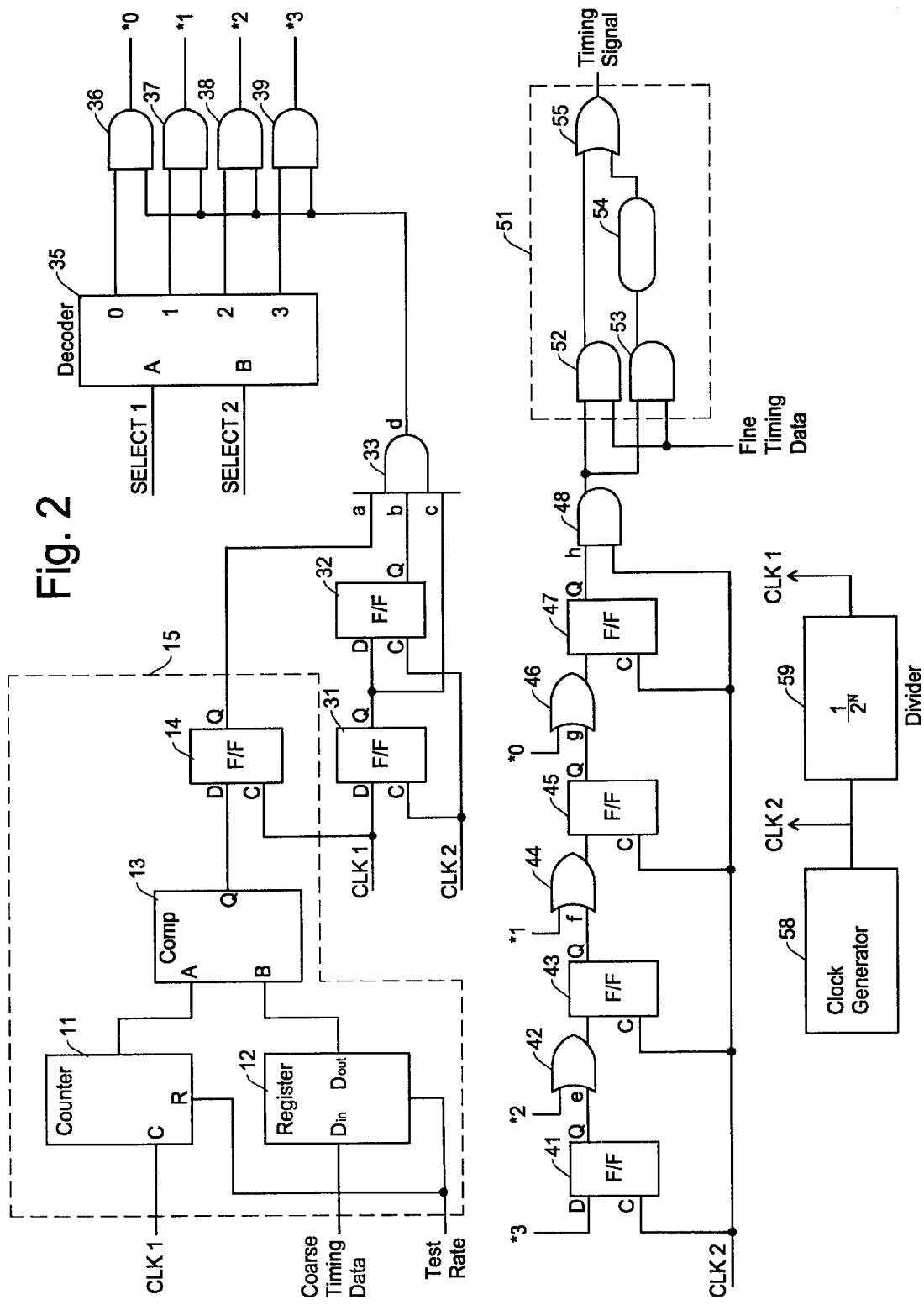
FIG. 2 is a block diagram showing an example of a basic structure of a timing signal generation circuit for a semiconductor test system in the present invention.

The embodiments of the present invention will be described with reference to the drawings. FIG. 2 is a block diagram showing an example of a basic structure of the timing signal generation circuit of the present invention. The upper left of FIG. 2 shows a coarse delay control unit 15 which is equivalent to the conventional coarse delay control unit shown in the upper part of FIG. 1. Further, it is assumed that a first reference clock CLK1 applied to the coarse delay control unit 15 is equivalent to the reference clock in the conventional technology of FIG. 1. One of the features of the present invention is that it includes a second reference clock CLK2 for producing delay times in a fine delay control unit. A circuit shown in the lower part of FIG. 2 is a clock generation circuit for generating the first and second reference clocks. In the timing signal generation circuit of the present invention, circuits provided with the second reference clock are configured by a high speed semiconductor circuit.

The timing signal generation circuit of FIG. 2 is described in more detail below. FIGS. 3A–3J are timing charts showing the operation of the timing signal generation circuit of FIG. 2. The coarse delay control unit 15 is formed of a counter 11, a register 12, a comparator 13, and a flip-flop 14. The coarse delay control unit 15 is provided with the first reference clock CLK1. The first reference clock is produced by dividing the frequency of the second reference clock by $\frac{1}{2^N}$ with a divider. The second reference clock is generated by a clock generator 58. In the following, follow up, the invention is explained for the case where the reference N is 2, i.e., the first reference clock has a frequency which is one-fourth of that of the second reference clock. Further, as noted above, the first reference clock CLK1 is equivalent to the reference clock used in the conventional technology of FIG. 1. The waveforms of the first and second reference clocks are shown in FIGS. 3A and 3B, respectively.

A test rate signal resets the counter 11, thereby loading the coarse delay data of the timing data in the register 12. The counter 11 counts the first reference clock CLK1. The counted data of the counter 11 is compared with the coarse delay data stored in the register 12 by the comparator 13. When both data match with one another, the comparator 13 produces a coincidence signal which is re-timed by the flip-flop 14. Thus, the coincidence signal at the output of the flip-flop 14 shows a delay time which is an integer multiple of the first reference clock CLK1. The waveform of the coincidence signal is shown in FIG. 3E. The delayed output signal from the AND gate will be provided with a delay time which is smaller than the first reference clock cycle by the fine delay control unit.

In FIG. 2, the upper right part of the fine delay control unit is configured with a re-timing circuit formed of flip-flops 31 and 32 and an AND gate 33, and a selector circuit formed of a decoder 35 and AND gates 36–39. In the re-timing circuit, the coincidence signal from the coarse delay control unit is timed by the second reference clock CLK2 thereby producing the output signal shown in FIG. 3F which is provided to the AND gates 36–39 in the selector circuit. In the selector circuit, in response to a select signal applied thereto, one of the AND gates is opened so that the output signal of the re-timing circuit is transmitted through the selected AND gate. In this example, since the number of AND gates is four, the select signal to the decoder 35 is configured by two bits. In the case where the data in the select signal shows "1, 0", the coincidence signal is selected through the AND gate 38 as shown in FIG. 3G. The select signal can be included in the timing data using appropriate data bits thereof, in the manner similar to the coarse delay data noted above.

The lower left portion of the fine delay control unit in FIG. 2 is a first fine delay circuit which is formed of flip-flops 41, 43, 45 and 47, OR gates 42, 44 and 46, an AND gate 48. The same numbers labeled by the mark * at the outputs of the AND gates of the selector circuit and the inputs of the flip flops show that the corresponding output and the input are connected with each other. Each of the flip-flops 41, 43, 45 and 47 is, for example, a D-type flip-flop, whose clock terminal is provided with the second reference clock CLK2. Since the input data is latched by the timing of the next clock at each flip-flop, the delay time equal to one cycle of the second reference clock is produced by each flip-flop. Therefore, for example, the input signal indicated by the mark *2 given to the OR gate 42 is delayed through the three stages of the flip-flops so that the delay time equal to three cycles of the second reference clock is produced as shown in FIGS. 3H, 3I and 3J. The delayed signal is provided to the AND gate 48. Similarly, for the input signal designated by the mark *3 which is given to the flip-flop 41, the delay time of four flip-flops, i.e., four cycles of the second reference clock is added to the input signal. In this example, the four cycles of the second reference clock CLK2 is equal to one cycle of the first reference clock CLK1.

The lower right portion of the fine delay control unit in FIG. 2 is a second fine delay circuit which is formed of AND gates 52 and 53, a delay element 54 and an OR gate 55. This circuit configuration is the same as that of the conventional fine delay circuit of FIG. 1 and is configured by the same type of semiconductor integrated circuit as the coarse delay control unit. By the fine timing data provided to the AND gates 52 and 53, either one of the signal propagation paths having the delay element or not having the delay element is selected. The fine timing data is created in the semiconductor test system as a part of the timing data. In an actual semiconductor test system, a large number of such second fine delay circuits having the weighted delay times are series connected to produce a final timing signal.

In the timing signal generation circuit of the present invention, a plurality of clocks, i.e., the second reference clock having a high frequency and the first reference clock having a frequency lower than the second reference clock, are used. The first reference clock is equivalent to the reference clock used in the conventional technology. The portions of the timing generation circuit that deal with the second reference clock are configured by the semiconductor integrated circuit of high speed operation, such as a bipolar integrated circuit or a gallium arsenide integrated circuit. The other portions of the circuit can be included in the large scale CMOS integrated circuit in the manner similar to the conventional technology. Since the circuit formed in the high speed integrated circuit such as the gallium arsenide or bipolar circuit is small in the circuit size, an increase in the physical size and cost is negligible relative to the overall semiconductor test system. Based on the foregoing arrangement, the timing signal generation circuit of the present invention produces a larger delay time within the fine delay time in synchronism with the higher frequency reference clock. As a result, it is possible to minimize the changes in the fine delay time caused by the voltage or temperature changes. A smaller delay time within the fine delay time is produced by the combination of the CMOS gates in the similar manner to the conventional technology. However, since the value of the delay time to be produced by the CMOS gates is smaller than the conventional technology, the number of CMOS gates can be dramatically reduced, resulting in the decrease of the delay time changes caused by the voltage or temperature changes.

As described in the foregoing, according to the present invention, the timing signal generation circuit can generate a fine delay time of high resolution and high stability with the use of a relatively simple circuit structure. The timing signal generation circuit can produce the fine delay time of high stability by creating a large delay time within the fine delay time by dividing a high frequency reference clock while creating a small delay time within the fine delay time by combination of gate circuits. The timing signal generation circuit includes a plurality of reference clocks and is capable of producing the fine delay time of high stability by creating a large delay time of the fine delay time by dividing a high frequency reference clock. As a consequence, the timing signal generator of the present invention can generate the timing signal which is not affected by voltage changes or temperature changes.

What is claimed is:

1. A timing signal generation circuit to be used in a semiconductor test system for producing a timing of a signal for testing a semiconductor device, comprising:

a first reference clock;

a coarse delay circuit provided with the first reference clock for generating a coarse delay signal having a delay time of an integer multiple of one cycle of the first reference clock on the basis of coarse delay data provided thereto;

a second reference clock having a frequency which is predetermined times higher than that of the first reference clock;

a first fine delay circuit provided with the second reference clock for producing a fine delay time which is an integer multiple of one cycle of the second reference clock but is smaller than the one cycle of the first reference clock;

a selector circuit for selectively applying the coarse delay signal to the first fine delay circuit at an input specified by a select signal; and a second fine delay circuit for receiving an output signal of the first fine delay circuit and adding a delay time which is smaller than the one cycle of the second reference clock to the output signal based on fine delay data;

wherein the coarse delay circuit and the second fine delay circuit are formed in a first semiconductor integrated circuit while the first fine delay circuit and the selector circuit are formed in a second semiconductor integrated circuit which has a higher operation speed than that of the first semiconductor integrated circuit.

2. A timing signal generation circuit as defined in claim 1, wherein the first reference clock is produced by dividing the frequency of the second reference clock into an integer number.

3. A timing signal generation circuit as defined in claim 1, wherein the coarse delay circuit is comprised of:
   a counter for counting the first reference clock;
   a register for storing the coarse delay data;
   a comparator for comparing counted data of the counter and the coarse delay data and producing a coincidence signal when both data match with each other.

4. A timing signal generation circuit as defined in claim 1, wherein the selector circuit is formed of a decoder for decoding the select signal and a plurality of AND gates which are controlled by a signal from the decoder.

5. A timing signal generation circuit as defined in claim 1, further including a re-timing circuit provided between the coarse delay circuit and the selector circuit for adjusting a timing of an incoming signal based on the second reference clock.

6. A timing signal generation circuit as defined in claim 1, wherein the first fine delay circuit has a plurality of series connected flip-flops, each of the flip-flops latching input data in synchronism with the second reference clock so as to produce a delay time equal to a multiple of the one cycle of the second reference clock.

7. A timing signal generation circuit as defined in claim 1, wherein the first fine delay circuit has a plurality of series connected flip-flops, the coarse delay signal selected by the selector circuit is provided to a selected input of the flip-flops, and the flip-flops latching the coarse delay signal in synchronism with the second reference clock so as to produce a delay time equal to a multiple of the one cycle of the second reference clock.

8. A timing signal generation circuit as defined in claim 1, wherein the first semiconductor integrated circuit is made of CMOS and the second semiconductor integrated circuit is made of bipolar or gallium arsenide.

9. A timing signal generation circuit as defined in claim 8, wherein the second fine delay circuit includes a delay element formed of a plurality of CMOS gates series connected with each other.

10. A method of generating a timing of a signal for testing a semiconductor device to be used in a semiconductor test system, comprising the following steps of:
   generating a coarse delay signal having a delay time which is an integer multiple of one cycle of a first reference clock on the basis of coarse delay data;
   producing a first fine delay time which is an integer multiple of one cycle of a second reference clock but is smaller than the one cycle of the first reference clock wherein the second reference clock has a frequency higher than that of the first reference clock by an integer multiple of times;
   selectively adding the first fine delay time to the coarse delay time; and
   adding a second fine delay time which is smaller than the one cycle of the second reference clock to the signal added with the first fine delay time.

* * * * *